(12) United States Patent
Daubenspeck et al.

(10) Patent No.: US 7,862,987 B2
(45) Date of Patent: Jan. 4, 2011

(54) METHOD FOR FORMING AN ELECTRICAL STRUCTURE COMPRISING MULTIPLE PHOTOSENSITIVE MATERIALS

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 475 days.

(21) Appl. No.: 11/942,753

(22) Filed: Nov. 20, 2007

(65) Prior Publication Data
US 2009/0130599 A1 May 21, 2009

(51) Int. Cl.
*G03F 7/26* (2006.01)
(52) U.S. Cl. .................................... 430/313; 430/327
(58) Field of Classification Search ............... 430/312, 430/311, 328, 322, 330, 327
See application file for complete search history.

(56) References Cited

U.S. PATENT DOCUMENTS

| 4,533,624 A | * | 8/1985 | Sheppard ..................... 430/312 |
| 4,567,132 A | * | 1/1986 | Fredericks et al. .......... 430/312 |
| 4,606,998 A | * | 8/1986 | Clodgo et al. ............... 430/312 |
| 6,398,430 B1 | * | 6/2002 | Jeoung et al. ............... 396/611 |
| 6,586,323 B1 | | 7/2003 | Fan et al. |
| 6,958,546 B2 | | 10/2005 | Fan et al. |
| 2007/0059650 A1 | * | 3/2007 | Nagahara et al. ............ 430/331 |

\* cited by examiner

*Primary Examiner*—Kathleen Duda
*Assistant Examiner*—Caleen O Sullivan
(74) *Attorney, Agent, or Firm*—Schmeiser, Olsen & Watts; Richard M. Kotulak

(57) ABSTRACT

An electrical structure and method of forming. The method comprises providing a substrate structure. A first layer comprising a first photosensitive material having a first polarity is formed over and in contact with the substrate structure. A second layer comprising photosensitive material having a second polarity is formed over and in contact with the first layer. The first polarity comprises an opposite polarity as the second polarity. Portions of the first and second layers are simultaneously exposed to a photo exposure light source. The portions of the first and second layers are developed such that structures are formed.

20 Claims, 12 Drawing Sheets

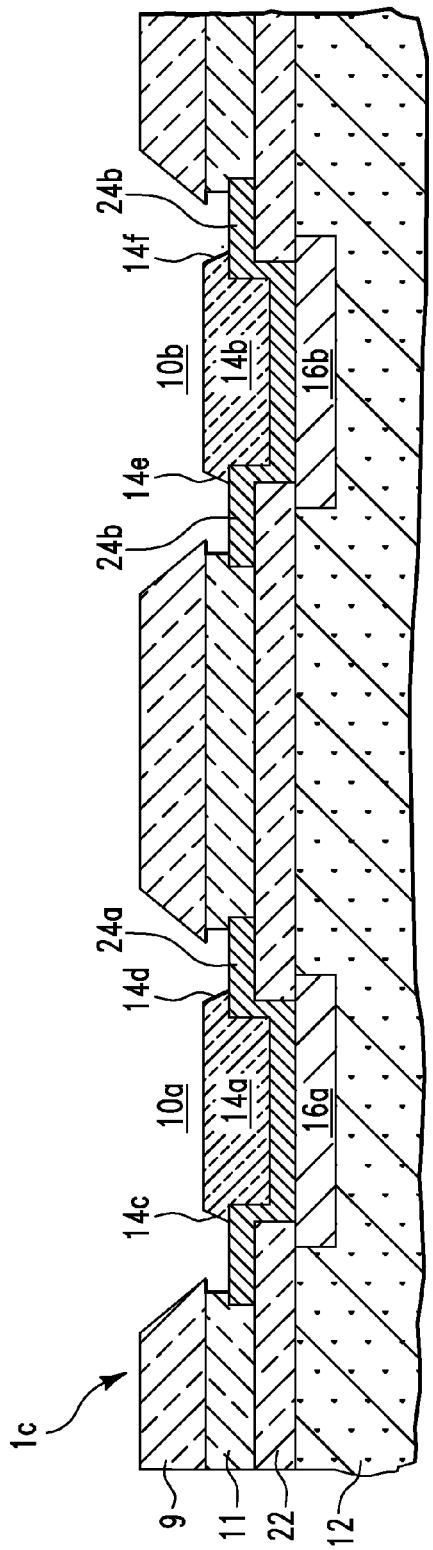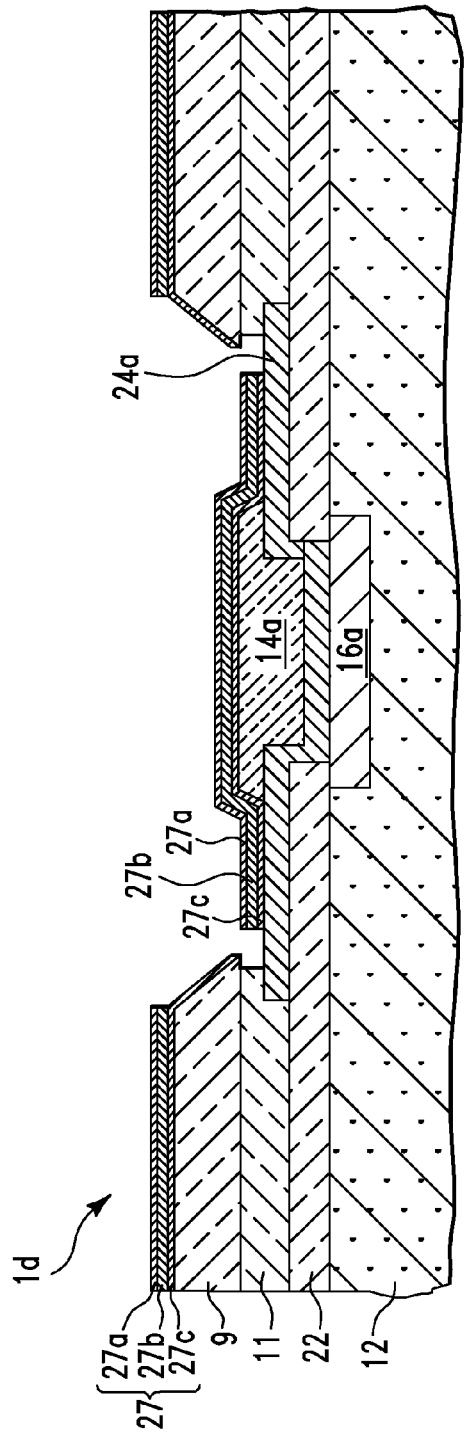
FIG. 1C
FIG. 1D

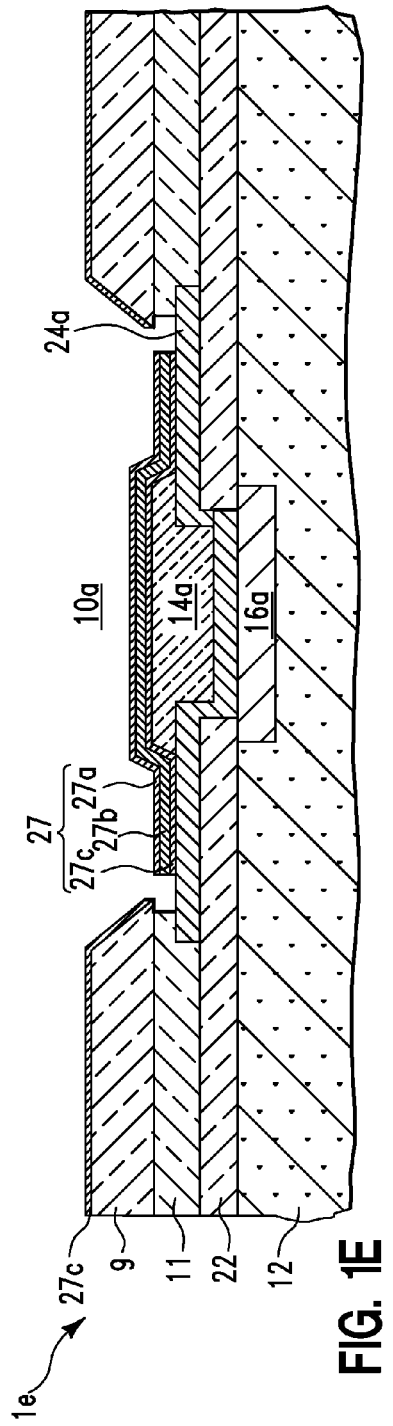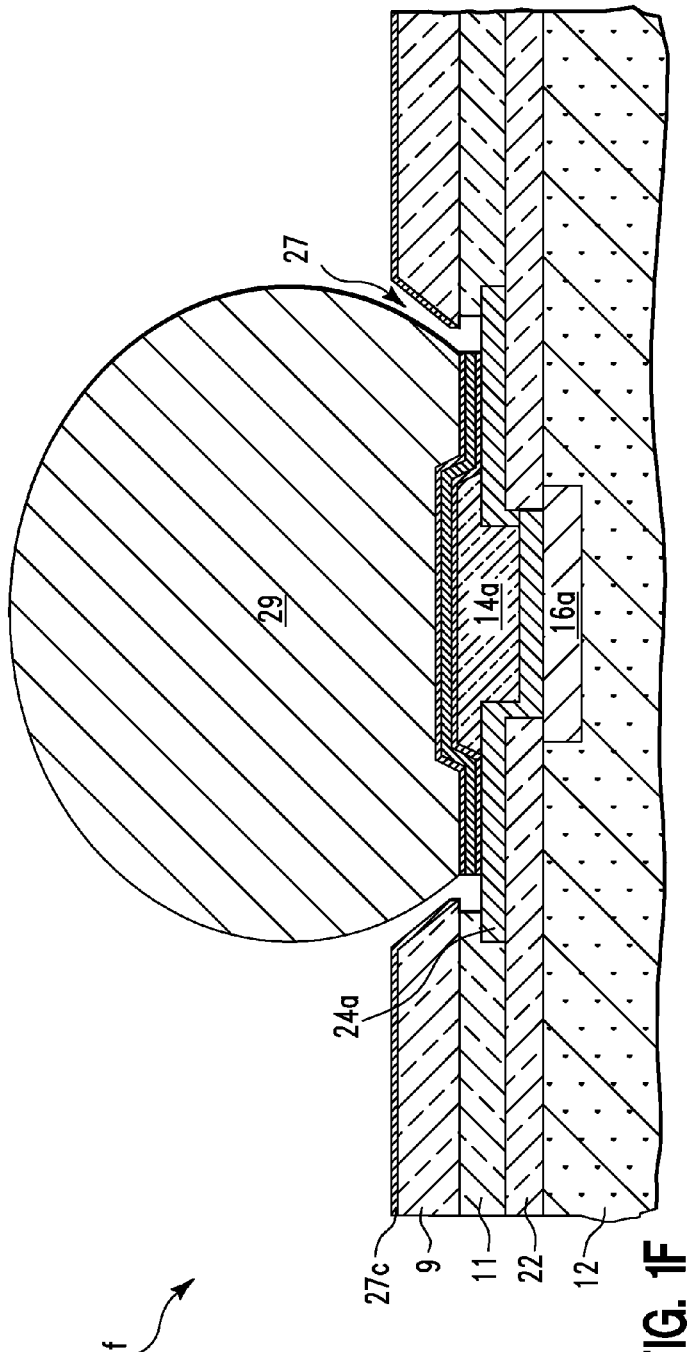

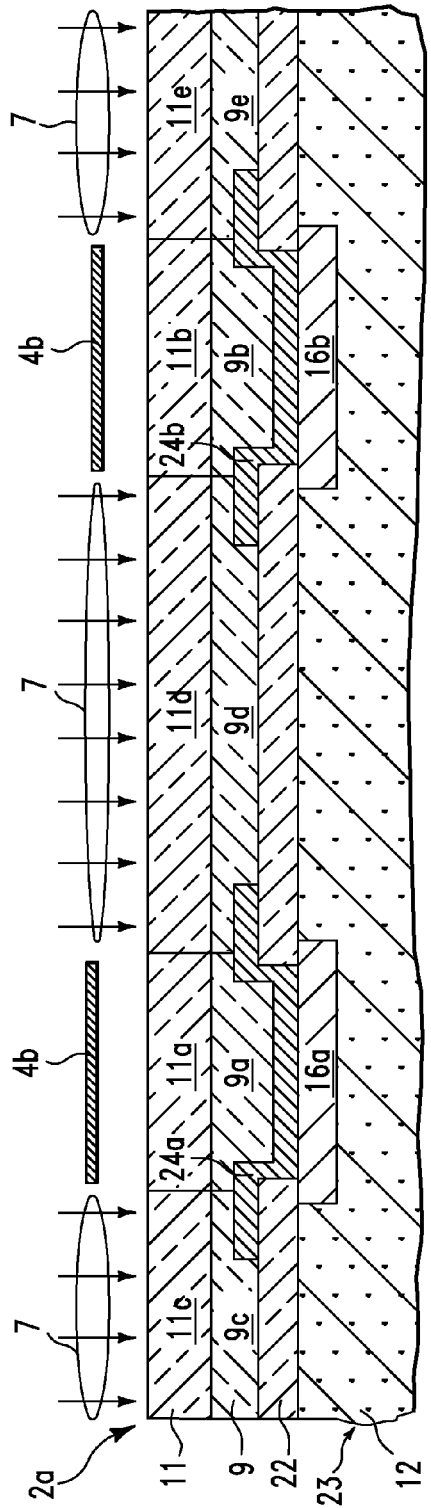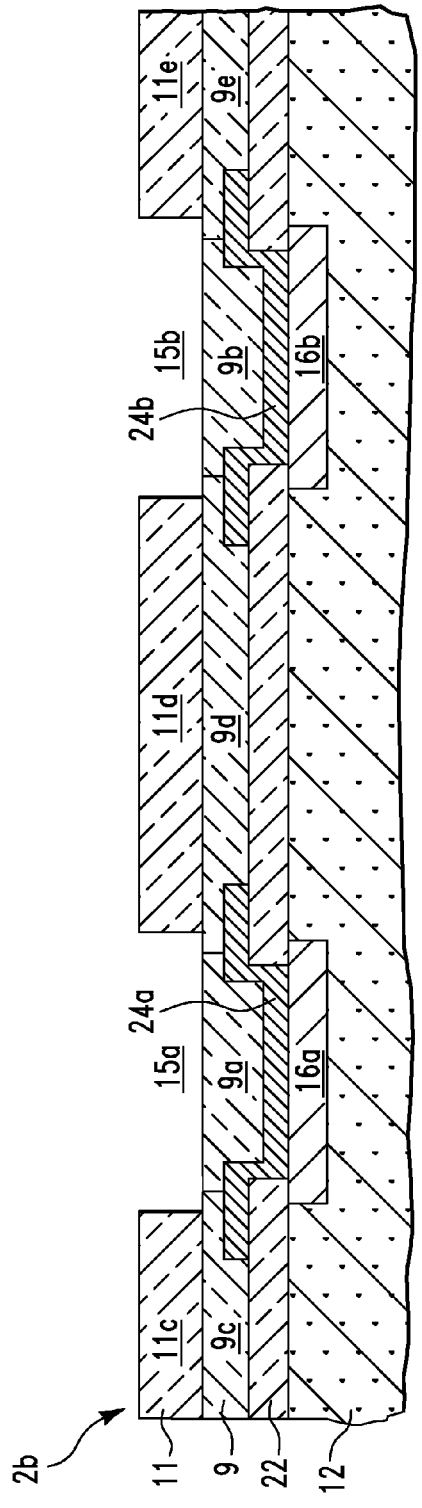

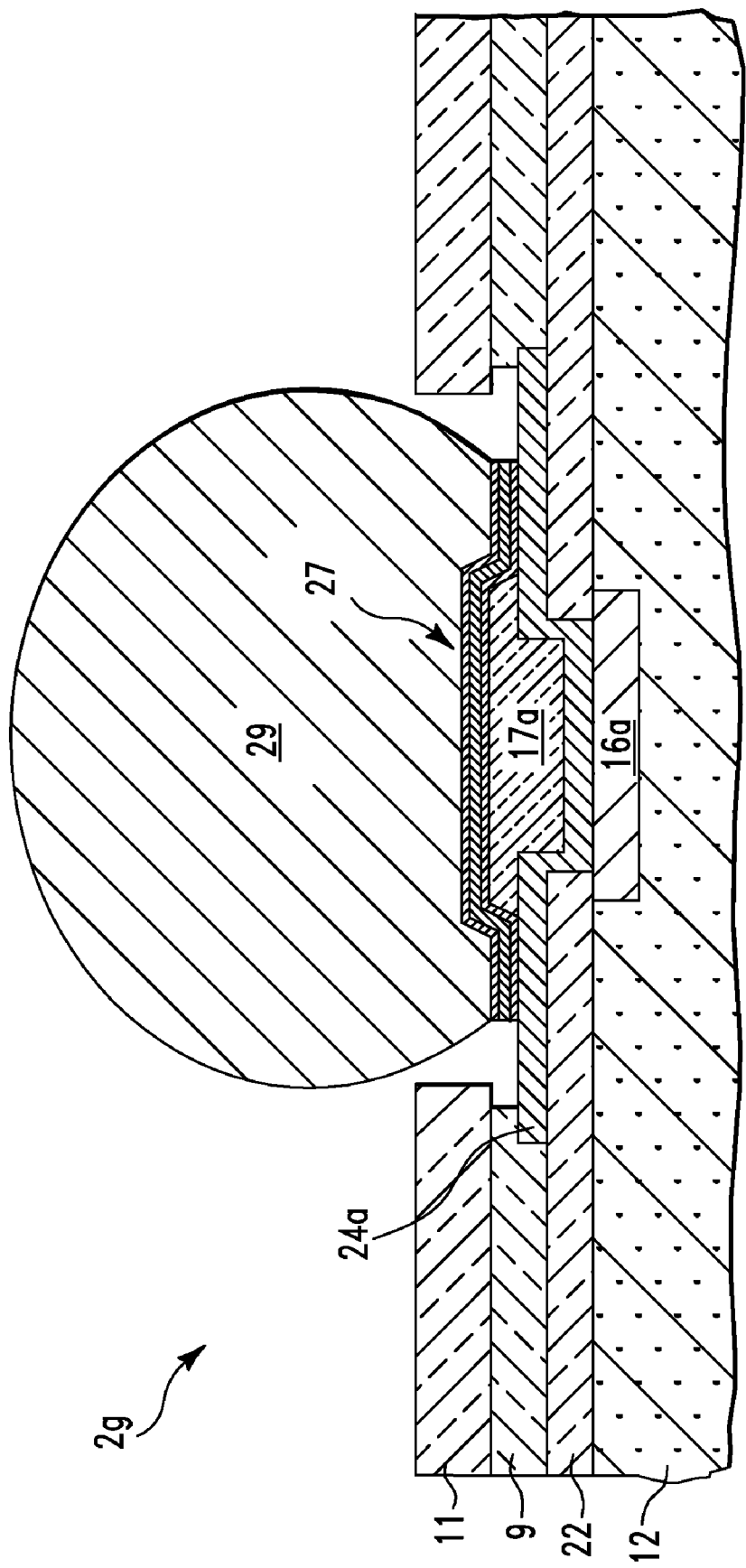

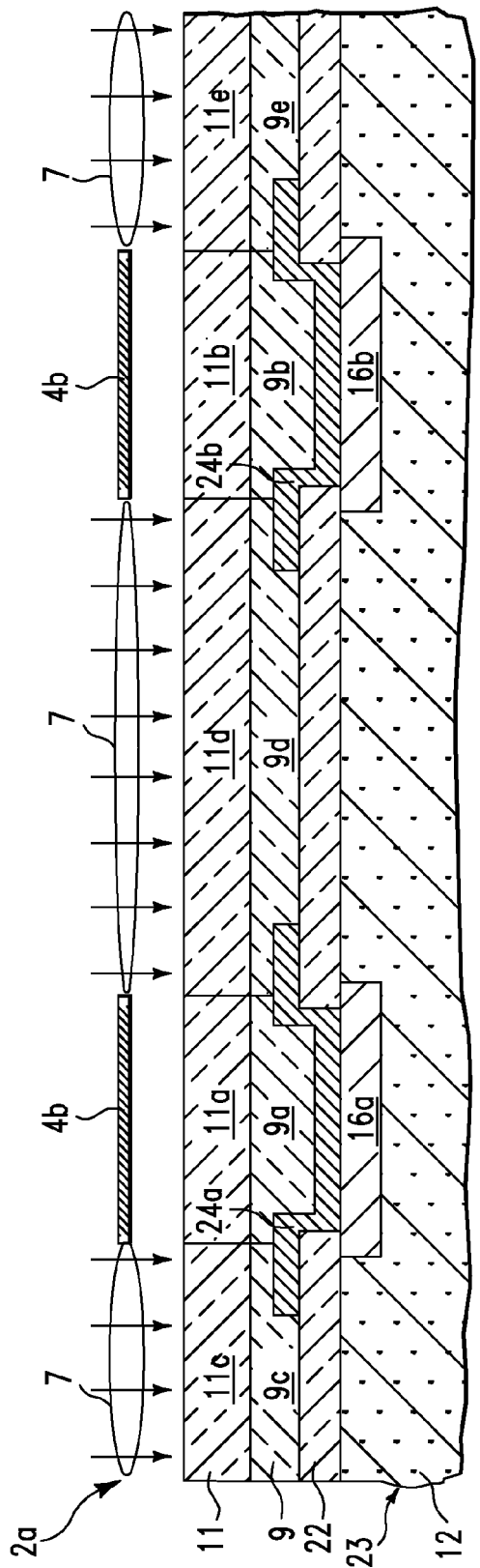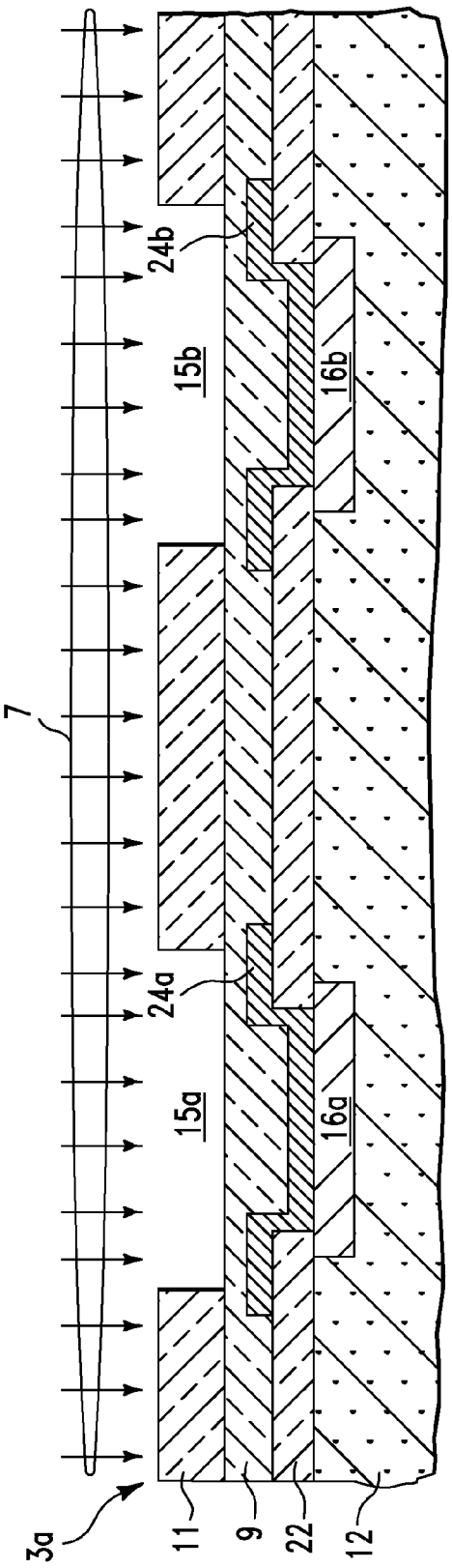
FIG. 3A
FIG. 3B

METHOD FOR FORMING AN ELECTRICAL STRUCTURE COMPRISING MULTIPLE PHOTOSENSITIVE MATERIALS

FIELD OF THE INVENTION

The present invention relates to an electrical structure comprising multiple photosensitive materials.

BACKGROUND OF THE INVENTION

Forming structures on a substrate typically requires a series of complicated and redundant steps. Accordingly, there exists a need in the art to overcome at least one of the deficiencies and limitations described herein above.

SUMMARY OF THE INVENTION

The present invention provides a method for forming an electrical structure comprising:

providing a first substrate structure;

forming a first layer over and in contact with said first substrate structure, said first layer comprising a first photosensitive material having a first polarity;

performing, after said forming said first layer, a first partial cure process of said first layer;

forming a second layer over and in contact with said first layer, said second layer comprising a second photosensitive material having a second polarity opposite to said first polarity;

performing, after said forming said second layer, a second partial cure process of said second layer;

placing, after said performing said second partial cure process, a mask structure over said second layer;

simultaneously exposing a portion of said second layer and a portion of said first layer to a photo exposure light source;

performing, after said simultaneously exposing, a third partial cure process of said portion of said second layer and said portion of said first layer;

first developing, after said performing said third partial cure process, said portion of said second layer such that a first structure is formed;

second developing, after said first developing, said portion of said first layer such that a second structure is formed; and performing, after said second developing, a full cure process of said first layer and said second layer.

The present invention provides a method for forming an electrical structure comprising:

providing a first substrate structure;

forming a first layer over and in contact with said first substrate structure, said first layer comprising a negative acting photosensitive material;

performing, after said forming said first layer, a first partial cure process of said first layer;

forming a second layer over and in contact with said first layer, said second layer comprising a positive acting photosensitive material;

performing, after said forming said second layer, a partial cure process of said second layer;

placing, after said performing said second partial cure process, a mask structure over said second layer;

simultaneously exposing a portion of said second layer and a portion of said first layer to a photo exposure light source;

performing, after said simultaneously exposing a third partial cure process of said portion of said second layer and said portion of said first layer;

first developing, after said simultaneously exposing, said portion of said second layer such that a first opening is formed in said second layer;

second developing, after said first developing, said portion of said first layer such that a first structure is formed from said portion of said first layer and a second opening is formed in a section of said first layer that surrounds said first structure; and performing, after said second developing, a full cure process of said second layer and said first layer.

The present invention provides a method for forming an electrical structure comprising:

providing a first substrate structure;

forming a first layer over and in contact with said first substrate structure, said first layer comprising a positive acting photosensitive material;

performing, after said forming said first layer, a first partial cure process of said first layer;

forming a second layer over and in contact with said first layer, said second layer comprising a negative acting photosensitive material;

performing, after said forming said second layer, a second partial cure process of said second layer;

placing, after performing said second partial cure process, a mask structure over said second layer;

simultaneously exposing a portion of said second layer and a portion of said first layer to a photo exposure light source;

performing, after said simultaneously exposing, a third partial cure process of said portion of said first layer and said portion of said second layer;

first developing, after said performing said third partial cure process, said portion of said second layer such that a first opening is formed in said second layer;

second developing, after said first developing, said portion of said first layer such that a first structure is formed from said portion of said first layer and a second opening is formed in a section of said first layer that surrounds said first structure; and performing, after said second developing, a full cure process of said first layer and said second layer.

The present invention provides a method for forming an electrical structure comprising:

providing a first substrate structure;

forming a first layer over and in contact with said first substrate structure, said first layer comprising a positive acting photosensitive material;

performing, after said forming said first layer, a first partial cure process of said first layer;

forming, a second layer over and in contact with said first layer, said second layer comprising a negative acting photosensitive material;

performing, after said forming said second layer, a second partial cure process of said second layer;

placing, after said performing, after said performing said second partial cure process, a mask structure over said second layer;

simultaneously exposing a portion of said first layer and a portion of said second layer to a photo exposure light source;

performing, after said simultaneously exposing, a third partial cure process of said portion of said first layer and said portion of said second layer;

first developing after said performing said third partial cure process, said portion of said second layer such that a first opening is formed in said second layer;

removing, after said first developing, said mask structure from over said second layer;

exposing, after said removing, said first layer and said second layer to said photo exposure light source; and second developing, after said exposing, said portion of said first layer such that a second opening is formed in said first layer, said second opening formed below said first opening.

The present invention advantageously provides a simple method for forming structures on a substrate.

BRIEF DESCRIPTION OF THE DRAWINGS

FIGS. 2A-2F illustrate a process for generating the electrical structure of FIG. 2G, in accordance with embodiments of the present invention.

DETAILED DESCRIPTION OF THE INVENTION

Figure 1A:
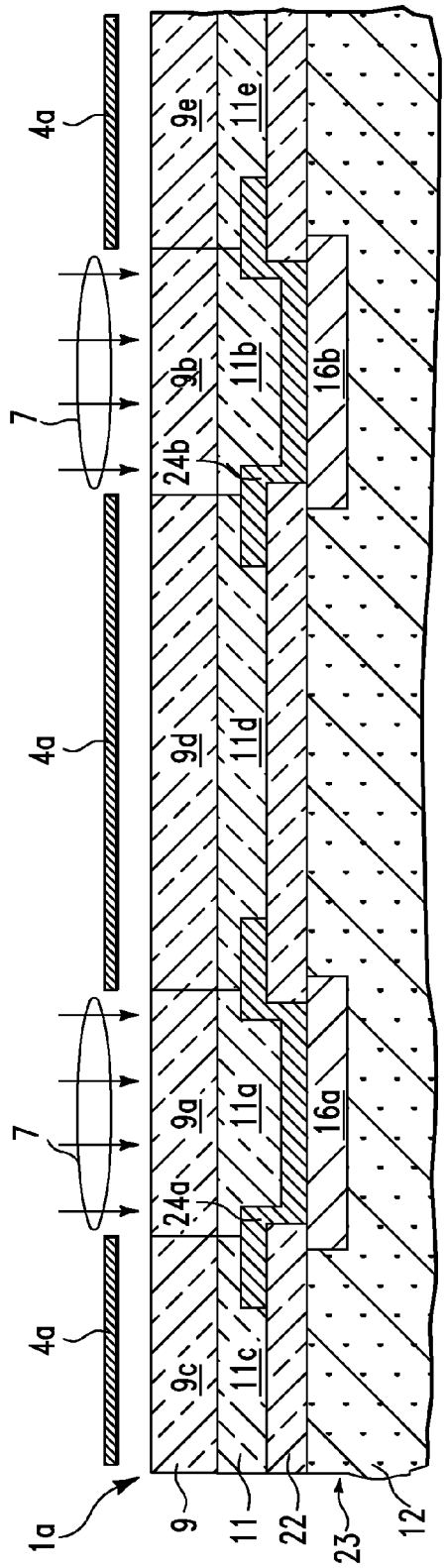
FIGS. 1A-1F illustrate a process for generating the electrical structure of FIG. 1G, in accordance with embodiments of the present invention.
Figure 1B:
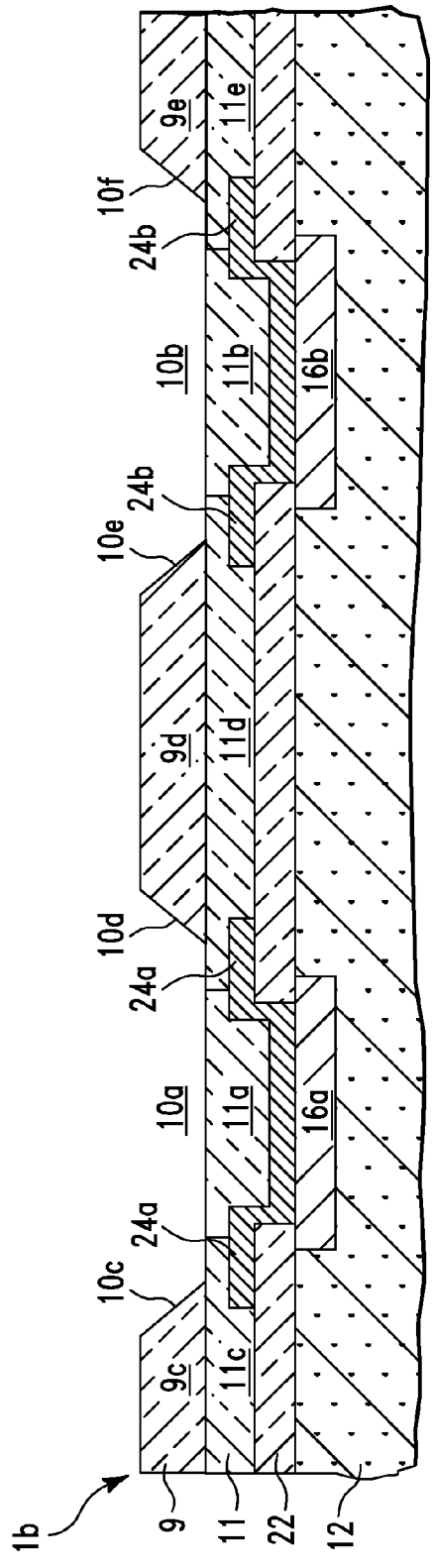
Figure 1G:
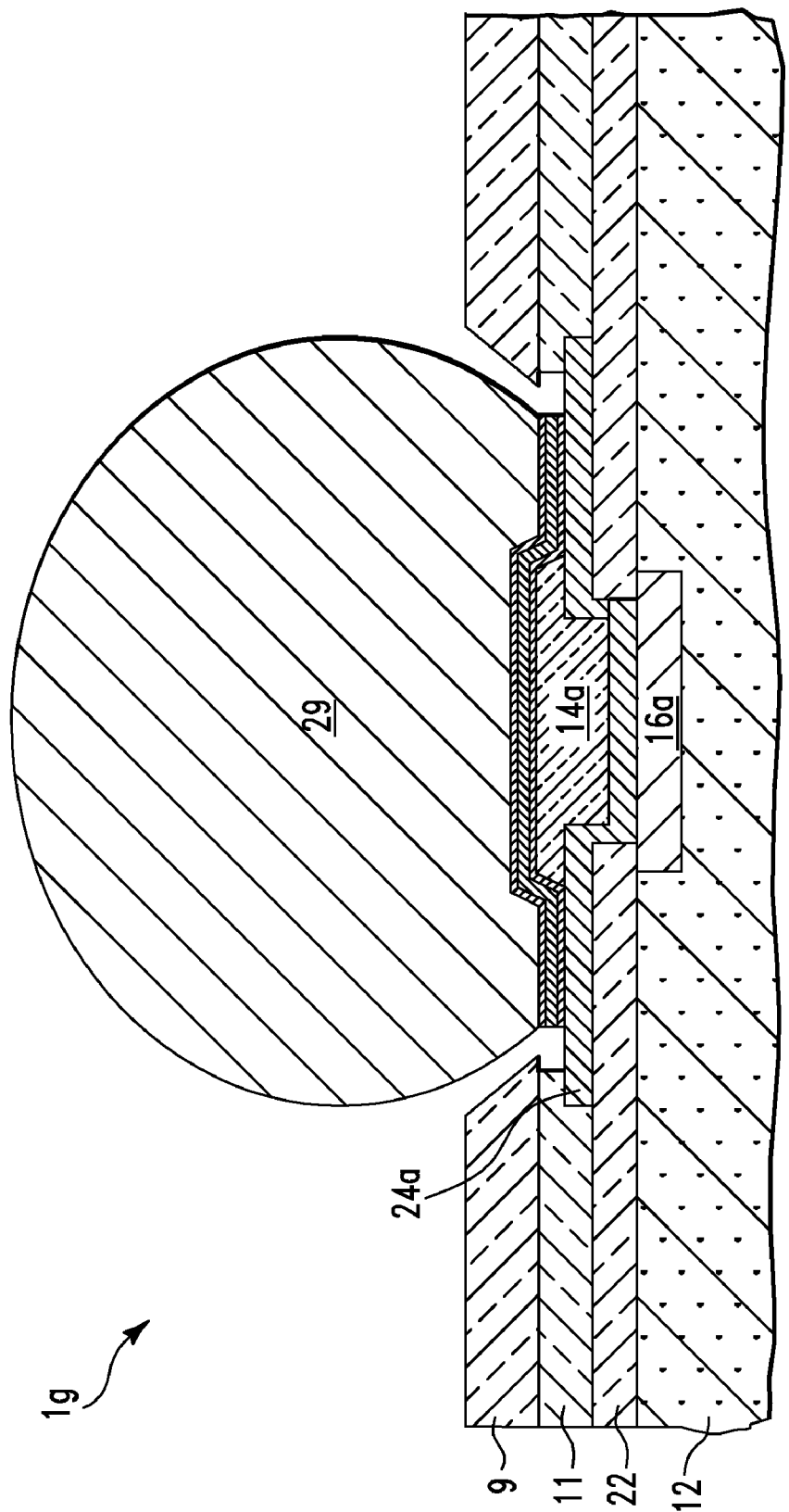

FIGS. 1A-1F illustrate a process for generating electrical structure 1g of FIG. 1G, in accordance with embodiments of the present invention.

FIG. 1A illustrates a cross sectional view of an electrical structure 1a, in accordance with embodiments of the present invention. Electrical structure 1a comprises a substrate structure 23, a photosensitive material layer 11, and a photosensitive material layer 9. Substrate structure 23 comprises a substrate 12, an insulator layer 22, electrically conductive wires 16a and 16b, and electrically conductive pads 24a and 24b. Conductive wires 16a and 16b are formed within substrate 12. Insulator layer 22 is formed over and in contact with substrate 12. Each of electrically conductive pads 24a and 24b comprise a portion formed within insulator layer 22 and a portion formed over a top surface of insulator layer 22. Electrically conductive pad 24a is electrically and mechanically connected to electrically conductive wire 16a. Electrically conductive pad 24b is electrically and mechanically connected to electrically conductive wire 16b. Substrate 12 may comprise, inter alia, a semiconductor device (e.g., an integrated circuit chip, a semiconductor wafer, etc), a chip carrier (organic or inorganic), a printed circuit board, etc.

Photosensitive material layer 11 is formed over and in contact with substrate structure 23. After photosensitive material layer 11 has been formed, photosensitive material layer 11 is partially cured. Photosensitive material layer 9 is formed over and in contact with photosensitive material layer 11. After photosensitive material layer 9 has been formed, photosensitive material layer 9 is partially cured. Photosensitive material layer 11 may comprise any type of photo sensitive material including, inter alia, a photo resist material, a photosensitive polyimide (PSPI) material, etc. Photosensitive material layer 9 may comprise any type of photo sensitive material including, inter alia, a photo resist material, a photosensitive polyimide (PSPI) material, etc. Photosensitive material layer 11 comprises is a negative acting (or negative polarity) photo sensitive material. A negative acting photo sensitive material comprises a negative optical lithographic polarity. A negative acting photo sensitive material is defined herein as a photo sensitive material that responds photo-actively to light (i.e., of appropriate wavelength and intensity) in such a way that an exposed region (i.e., to the light) becomes insoluble in a developer solution and an unexposed region would become soluble in a developer solution. Photosensitive material layer 9 comprises is a positive acting (or positive polarity) photo sensitive material. A positive acting photo sensitive material comprises a positive optical lithographic polarity. A positive acting photo sensitive material is defined herein as a photo sensitive material that responds photo-actively to light (i.e., of appropriate wavelength and intensity) in such a way that an exposed region becomes soluble in a developer solution and an unexposed region would become insoluble in a developer solution. A developer solution may comprise a solvent developer solution, an acid-base developer solution, etc.

In order to generate structures (e.g., openings or physical structures) from photosensitive material layer 11 and photosensitive material layer 9, portions 9a and 9b of photosensitive material layer 9 and portions 11a and 11b of photosensitive material layer 11 are simultaneously exposed to a photo exposure light source 7 (i.e., using a common wavelength such as, inter alia, 365 nm) through a mask structure 4a (i.e., mask structure 4a prevents photo exposure light source 7 from exposing portions 11c, 11d, 11e, 9c, and 9d, and 9e). Photo exposure light source 7 is directed onto portions 9a and 9b of photosensitive material layer 9 and portions 11a and 11b of photosensitive material layer 11 by mask structure 4a. Mask structure 4a comprises openings to allow photo exposure light source 7 through to portions 9a, 9b, 11a, and 11b and closed portions to prevent photo exposure light source 7 from reaching other portions (e.g., portions 11c, 11d, 11e, 9c, 9d, and 9e) of photosensitive material layer 9 and photosensitive material layer 11.

FIG. 1B illustrates a cross sectional view of electrical structure 1a of FIG. 1A after an acid based developer solution has been applied to photosensitive material layer 9, in accordance with embodiments of the present invention. In contrast to electrical structure 1a of FIG. 1A, electrical structure 1b of FIG. 1B comprises openings 10a and 10b. After photo exposure light source 7 exposes portions 9a and 9b of photosensitive material layer 9 and portions 11a and 11b of photosensitive material layer 11, an acid based developer solution is selectively applied to photosensitive material layer 9 in order to form openings 10a and 10b. Opening 10a comprises tapered sidewalls 10c and 10d. Opening 10b comprises tapered sidewalls 10e and 10f.

FIG. 1C illustrates a cross sectional view of electrical structure 1b of FIG. 1B after a solvent based developer solution has been applied to photosensitive material layer 11, in accordance with embodiments of the present invention. In contrast to electrical structure 1b of FIG. 1B, electrical structure 1c of FIG. 1C comprises structures 14a and 14b. After openings 10a and 10b are formed, a solvent based developer solution is selectively applied to photosensitive material layer 11 in order to form structures 14a and 14b. Structure 14a comprises tapered sidewalls 14c and 14d. Structure 14b comprises tapered sidewalls 14e and 14f. Photosensitive material layer 9, photosensitive material layer 11, structure 14a, and structure 14b in FIG. 1C have been fully cured (i.e., at a specified temperature).

FIG. 1D illustrates a cross sectional view of electrical structure 1c of FIG. 1C after a ball limiting metallurgy (BLM) structure 27 has been formed, in accordance with embodiments of the present invention. Electrical structure 1d of FIG. 1D illustrates a portion (i.e., comprising structure 14a and opening 10a) of electrical structure 1c of FIG. 1C. In contrast to electrical structure 1c of FIG. 1C, electrical structure 1d of FIG. 1D comprises BLM structure 27. BLM structure 27 may be formed using any method including, inter alia, sputter deposition. BLM structure 27 comprises layer 27a, layer 27b, and layer 27c. Layer 27a may comprise, inter alia, nickel, etc. Layer 27b may comprise, inter alia, copper, etc. Layer 27c may comprise, inter alia, titanium, tungsten, etc. BLM structure 27 is formed over and in contact with structure 14a and electrically conductive pad 24a.

FIG. 1E illustrates a cross sectional view of electrical structure 1d of FIG. 1D after portions of BLM structure 27 have been removed, in accordance with embodiments of the present invention. In contrast to electrical structure 1d of FIG. 1D, electrical structure 1e of FIG. 1E has portions of layers 27a and 27b removed. The portions of layers 27a and 27b have been removed from over photosensitive material layer 9. The portions of layers 27a and 27b may be removed by any process including, inter alia, a chemical mechanical polishing (CMP) process.

FIG. 1F illustrates a cross sectional view of electrical structure 1e of FIG. 1E after a solder structure 29 has been formed, in accordance with embodiments of the present invention. In contrast to electrical structure 1e of FIG. 1E, electrical structure 1f of FIG. 1F comprises a solder structure 29 electrically and mechanically connected to the portion of BLM layer 27 that remains over structure 14a (i.e., comprising the negative acting photosensitive material) and electrically conductive pad 24a. Solder structure 29 may comprise any type of solder structure including, inter alia, a controlled collapse chip connection (C4) solder structure. Solder structure 29 may comprise any type of solder material including, inter alia, an alloy of tin such as SnCu, SnAgCu, SnPb, etc.

FIG. 1G illustrates a cross sectional view of electrical structure 1f of FIG. 1F after layer 27c has been removed from over photosensitive material layer 9, in accordance with embodiments of the present invention. Layer 27c may be removed using any process including, inter alia, a reactive ion etch (RIE) process.

Figure 2C:
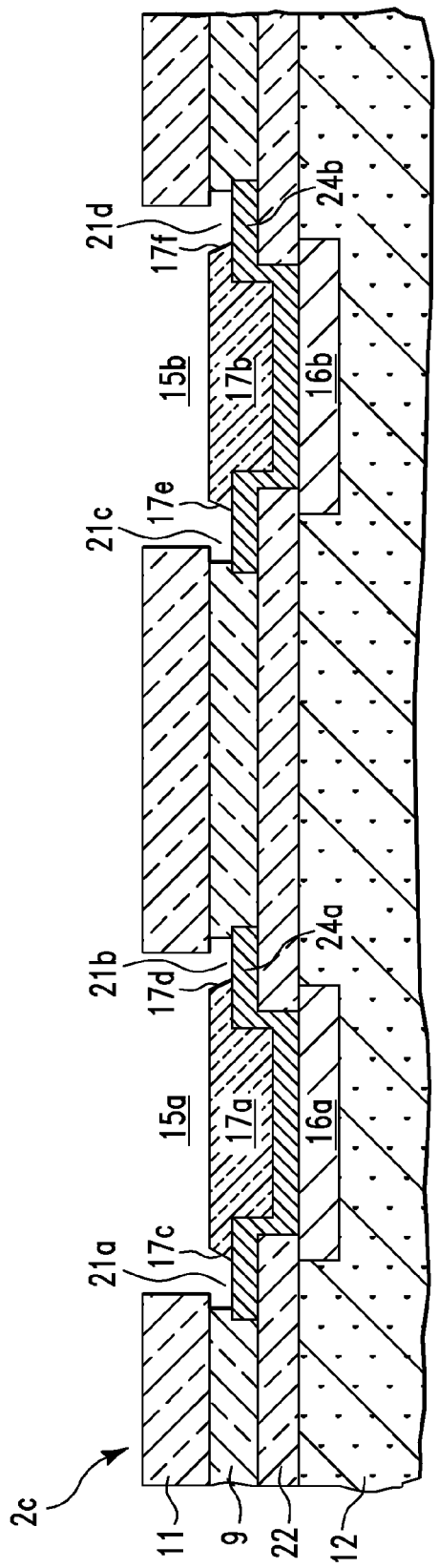

FIGS. 2A-2F illustrate a process for generating electrical structure 2g of FIG. 2G, in accordance with embodiments of the present invention.

FIG. 2A illustrates a cross sectional view of an electrical structure 2a, in accordance with embodiments of the present invention. Electrical structure 1a comprises a substrate structure 23 (i.e., see substrate structure 23 of FIGS. 1A-1G), a photosensitive material layer 9, and a photosensitive material layer 11.

Photosensitive material layer 9 is formed over and in contact with substrate structure 23. After photosensitive material layer 9 has been formed, photosensitive material layer 9 is partially cured. Photosensitive material layer 11 is formed over and in contact with photosensitive material layer 9. After photosensitive material layer 11 has been formed, photosensitive material layer 11 is partially cured. Photosensitive material layer 9 may comprise any type of photo sensitive material including, inter alia, a photo resist material, a photosensitive polyimide (PSPI) material, etc. Photosensitive material layer 11 may comprise any type of photo sensitive material including, inter alia, a photo resist material, a photosensitive polyimide (PSPI) material, etc. Photosensitive material layer 11 comprises is a negative acting (or negative polarity) photo sensitive material. Photosensitive material layer 9 comprises a positive acting (or positive polarity) photo sensitive material.

In order to generate structures (e.g., openings or physical structures) from photosensitive material layer 9 and photosensitive material layer 11, portions 11c, 11d, and 11e of photosensitive material layer 11 and portions 9c, 9d, and 9e of photosensitive material layer 9 are simultaneously exposed to a photo exposure light source 7 (i.e., using a common wavelength such as, inter alia, 365 nm) through a mask structure 4b (i.e., mask structure 4b prevents photo exposure light source 7 from exposing portions 11a, 11b, 9a, and 9b). Photo exposure light source 7 is directed onto portions 11c, 11d, and 11e and portions 9c, 9d, and 9e by mask structure 4b. Mask structure 4b comprises openings to allow photo exposure light source 7 through to portions 9c, 9d, 9e, 11c, 11d, and 11e and closed portions to prevent photo exposure light source 7 from reaching other portions 11a, 11b, 9a, and 9b of photosensitive material layer 9 and photosensitive material layer 11.

FIG. 2B illustrates a cross sectional view of electrical structure 2a of FIG. 2A after a solvent based developer solution has been applied to photosensitive material layer 11, in accordance with embodiments of the present invention. In contrast to electrical structure 2a of FIG. 2A, electrical structure 2b of FIG. 2B comprises openings 15a and 15b. After photo exposure light source 7 exposes portions 9c, 9d, 9e, 11c, 11d, and 11e, a solvent based developer solution is selectively applied to photosensitive material layer 9 in order to form openings 15a and 15b.

FIG. 2C illustrates a cross sectional view of electrical structure 2b of FIG. 2B after an acid based developer solution has been applied to photosensitive material layer 9, in accordance with embodiments of the present invention. In contrast to electrical structure 2b of FIG. 2B, electrical structure 2c of FIG. 2C comprises structures 17a and 17b. After openings 15a and 15b are formed, an acid based developer solution is selectively applied to photosensitive material layer 9 in order to form structures 17a and 17b. Structure 17a comprises openings 21a and 21b surrounding structure 17a. Structure 17b comprises openings 21c and 21d surrounding structure 17b. Structure 17a may comprise tapered sidewalls 17c and 17d. Structure 17b may comprise tapered sidewalls 17e and 17f. Photosensitive material layer 9, photosensitive material layer 11, structure 17a, and structure 17b in FIG. 1C have been fully cured (i.e., at a specified temperature).

Figure 2D:
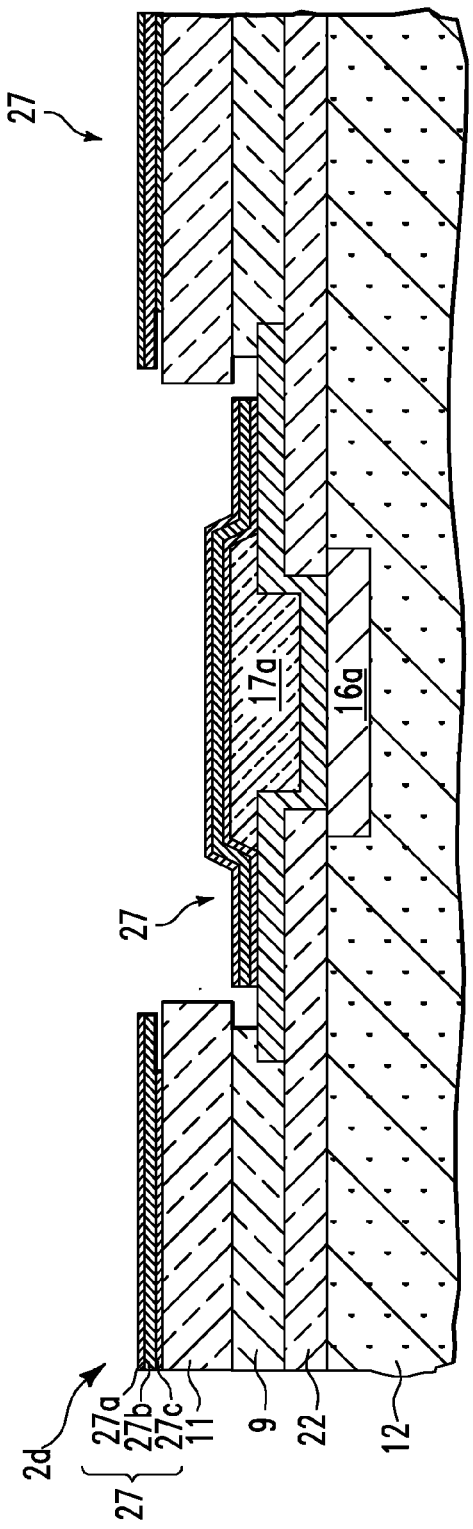

FIG. 2D illustrates a cross sectional view of electrical structure 2c of FIG. 2C after a ball limiting metallurgy (BLM) structure 27 has been formed, in accordance with embodiments of the present invention. Electrical structure 2d of FIG. 2D illustrates a portion (i.e., comprising structure 17a and opening 15a) of electrical structure 2c of FIG. 2C.

Figure 2E:
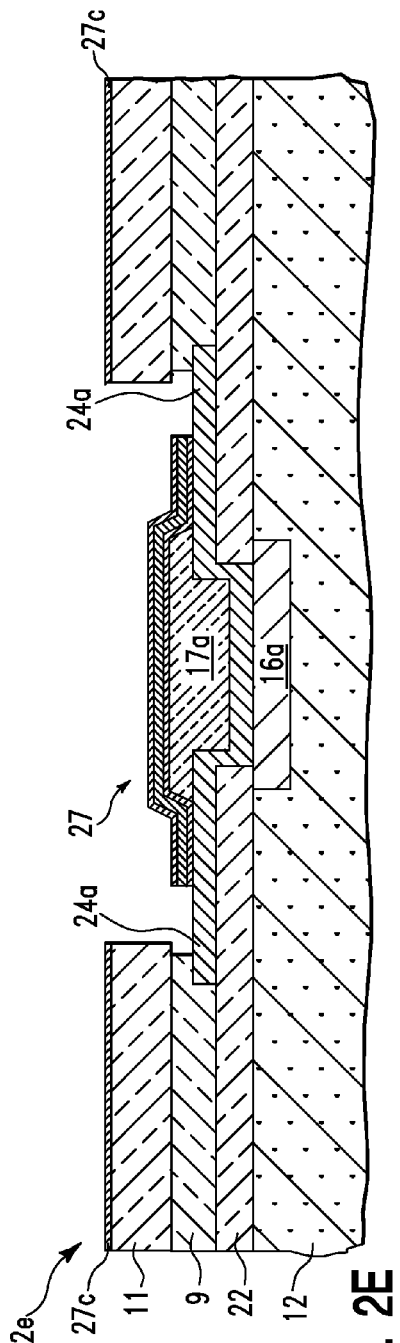

FIG. 2E illustrates a cross sectional view of electrical structure 2d of FIG. 2D after portions of BLM structure 27 have been removed, in accordance with embodiments of the present invention. In contrast to electrical structure 2d of FIG. 2D, electrical structure 2e of FIG. 2E has portions of layers 27a and 27b removed. The portions of layers 27a and 27b have been removed from over photosensitive material layer 11. The portions of layers 27a and 27b may be removed by any process including, inter alia, a chemical mechanical polishing (CMP) process.

Figure 2F:
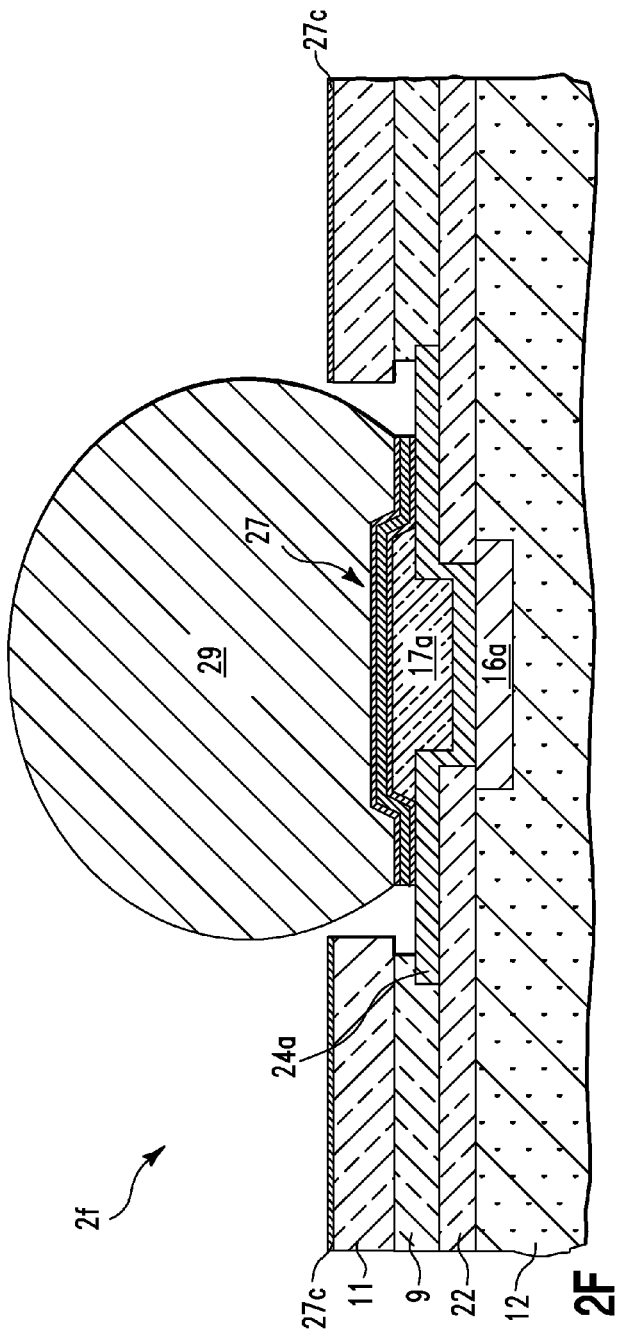

FIG. 2F illustrates a cross sectional view of electrical structure 2e of FIG. 2E after a solder structure 29 has been formed, in accordance with embodiments of the present invention. In contrast to electrical structure 2e of FIG. 2E, electrical structure 2f of FIG. 2F comprises a solder structure 29 electrically and mechanically connected to the portion of BLM layer 27 that remains over structure 17a (i.e., comprising the positive acting photosensitive material). Solder structure 29 may comprise any type of solder structure including, inter alia, a controlled collapse chip connection (C4) solder structure. Solder structure 29 may comprise any type of solder material including, inter alia, an alloy of tin such as SnCu, SnAgCu, SnPb, etc.

FIG. 2G illustrates a cross sectional view of electrical structure 2f of FIG. 2F after layer 27c has been removed from over photosensitive material layer 11, in accordance with embodiments of the present invention. Layer 27c may be removed using any process including, inter alia, a reactive ion etch (RIE) process.

Figure 3C:
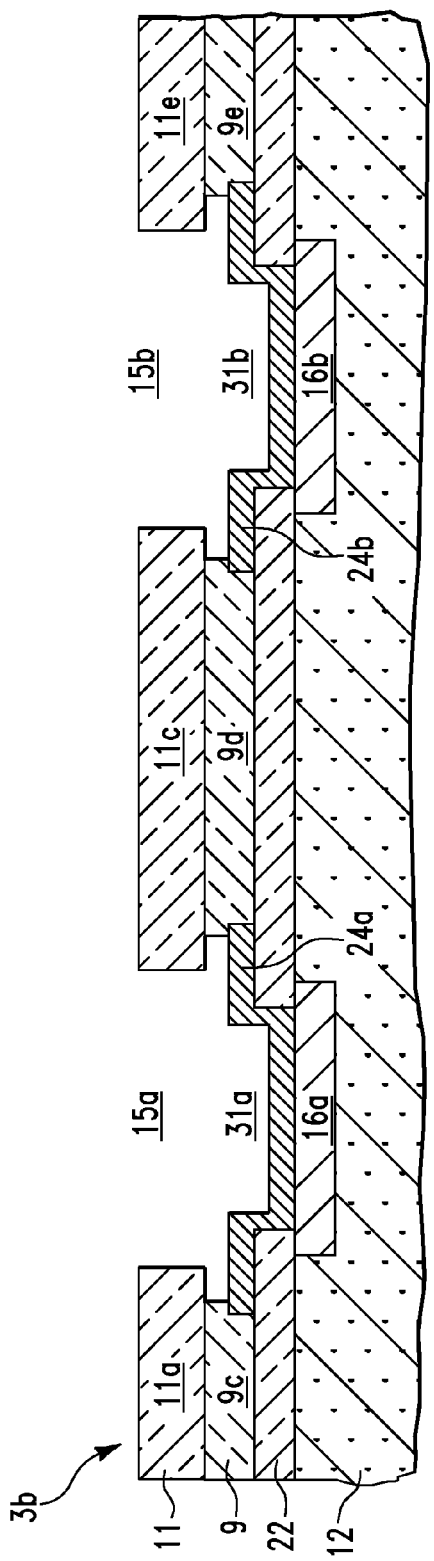
FIGS. 3A-3D illustrate a process for generating the electrical structure of FIG. 3E, in accordance with embodiments of the present invention.
Figure 3D:
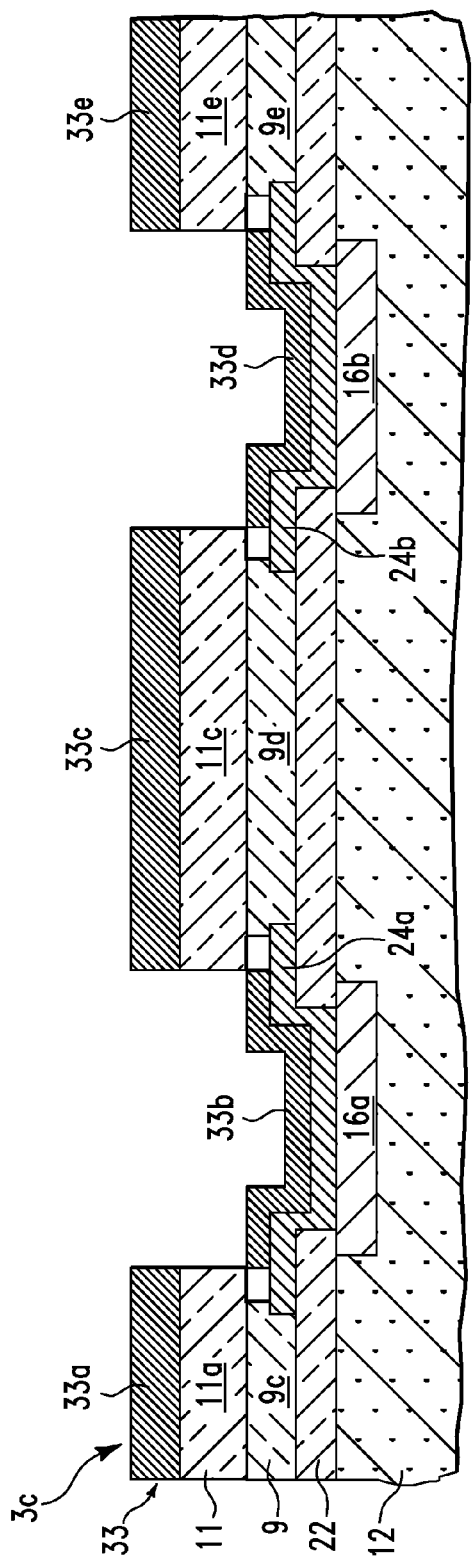
Figure 3E:
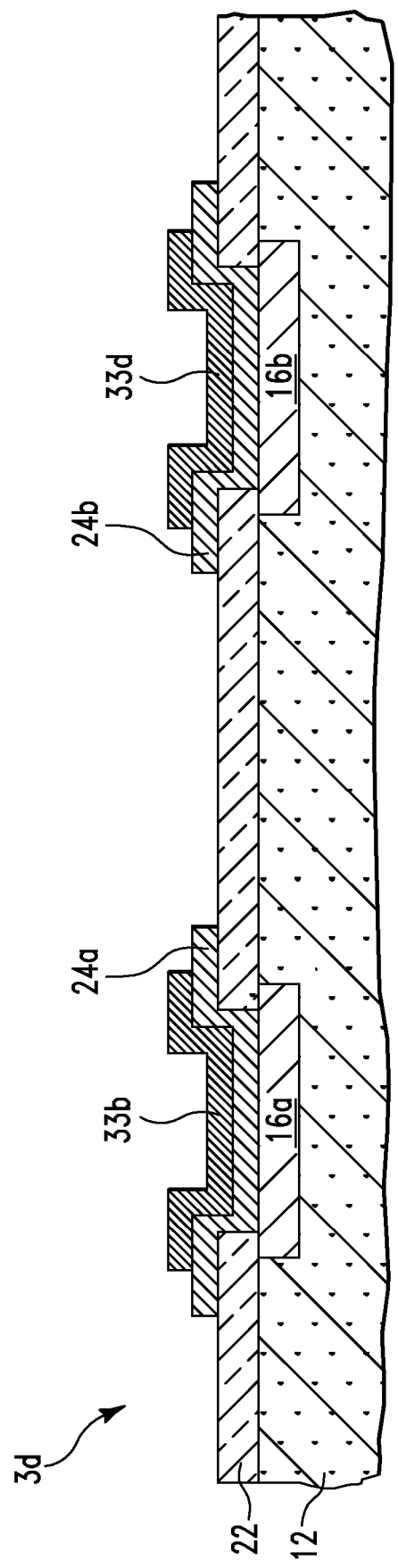

FIGS. 3A-3D illustrate a process for generating electrical structure 3d of FIG. 3E, in accordance with embodiments of the present invention.

FIG. 3A illustrates a cross sectional view of electrical structure 2a of FIG. 2A, in accordance with embodiments of the present invention. Portions 11c, 11d, and 11e of photosensitive material layer 11 and portions 9c, 9d, and 9e of photosensitive material layer 9 have been simultaneously exposed to photo exposure light source 7 (i.e., using a common wavelength such as, inter alia, 365 nm) through mask structure 4b.

FIG. 3B illustrates a cross sectional view of electrical structure 2a of FIG. 3A after a solvent based developer solution has been applied to photosensitive material layer 11, in accordance with embodiments of the present invention. In contrast to electrical structure 2a of FIG. 3A, electrical structure 3a of FIG. 3B comprises openings 15a and 15b. After photo exposure light source 7 exposes portions 9c, 9d, 9e, 11c, 11d, and 11e, a solvent based developer solution is selectively applied to photosensitive material layer 9 in order to form openings 15a and 15b. Additionally, a blanket exposure process is performed in order to blanket expose (i.e., expose without the use of a mask) electrical structure 3a to photo exposure light source 7.

FIG. 3C illustrates a cross sectional view of electrical structure 3a of FIG. 3B after an acid based developer solution has been applied to photosensitive material layer 9, in accordance with embodiments of the present invention. In contrast to electrical structure 3a of FIG. 3B, electrical structure 3b of FIG. 3C comprises openings 31a and 31b. After openings 15a and 15b are formed, an acid based developer solution is selectively applied to photosensitive material layer 9 in order to form openings 31a and 31b.

FIG. 3D illustrates a cross sectional view of electrical structure 3b of FIG. 3C after a conductive layer 33 has been formed, in accordance with embodiments of the present invention. Conductive layer 33 may comprise any conductive material including, inter alia, a metallic material, etc. Conductive layer 33 comprises portions 33a . . . 33e. Portions 33a, 33c, and 33e are formed over remaining portion of photosensitive material layer 11 (i.e., portions 11a, 11c, and 11e). Portion 33b is formed over and in contact (electrical and mechanical) with electrically conductive pad 24a. Portion 33d is formed over and in contact (electrical and mechanical) with electrically conductive pad 24b. Portions 33b and 33d may be wires.

FIG. 3E illustrates a cross sectional view of electrical structure 3c of FIG. 3D after portions 33a, 33c, and 33e of conductive layer 33 and portions 11a, 11c, 11e, 9c, 9d, and 9e of photosensitive material layers 11 and 9 have been removed, in accordance with embodiments of the present invention.

Figure 4:
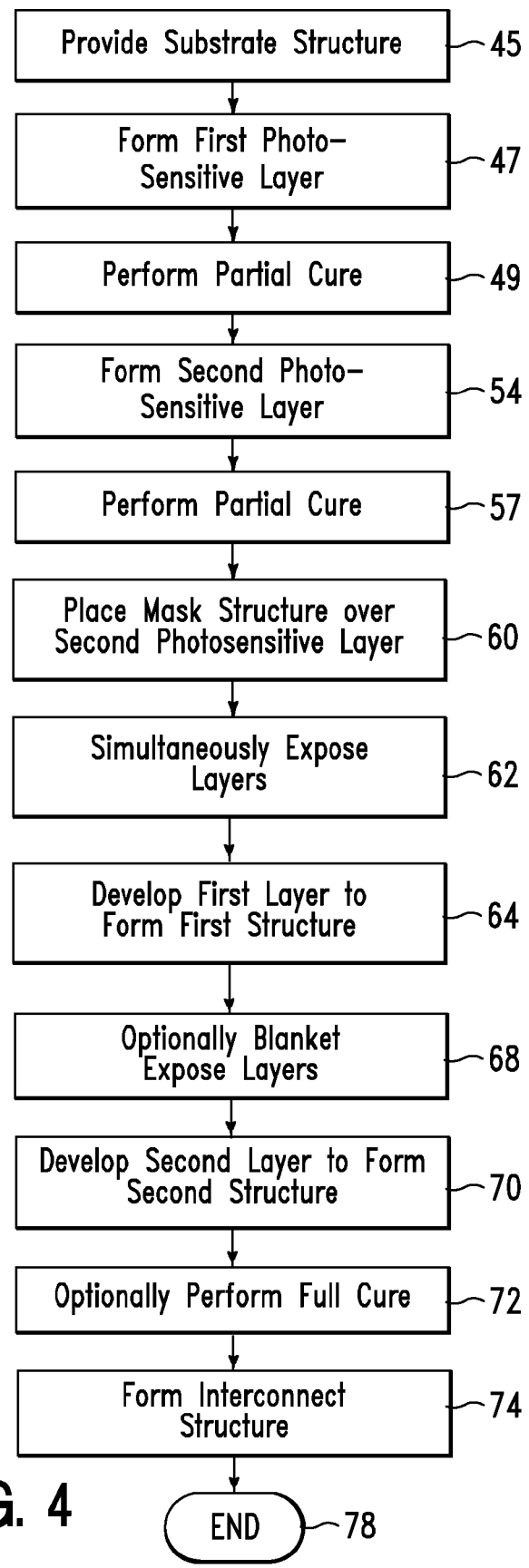
FIG. 4 illustrates a flowchart detailing process steps for forming the structures of FIGS. 1G, 2G, and 3E, in accordance with embodiments of the present invention.

FIG. 4 illustrates a flowchart detailing process steps for forming structures 1g, 2g, and 33d of FIGS. 1G, 2G, and 3E, in accordance with embodiments of the present invention. In step 45, a substrate structure 23 is provided. In step 47, a first photosensitive material layer is formed over substrate structure 23. The first photosensitive material layer may comprise a negative acting photosensitive material layer (i.e., as illustrated in FIGS. 1A-1G) or a positive acting photosensitive material layer (i.e., as illustrated in FIGS. 2A-2G and 3A-3E).

In step 49, the first photosensitive material layer is partially cured. In step 54, a second photosensitive material layer is formed the first photosensitive material layer. The second photosensitive material layer comprises an opposite polarity from the first photosensitive material layer. In step 57, the second photosensitive material layer is partially cured. In step 60, a mask structure is placed over the second photosensitive material layer. In step 62, portions of the second photosensitive material layer the first photosensitive material layer are simultaneously exposed to a photo exposure light source and a partial cure process is performed on the portions of the photosensitive material layers. In step 64, the exposed portions of the second photosensitive material layer are developed such that a first structure (i.e., a structure or an opening) is formed. In step 68, an optional blanket exposure process is performed (i.e., in the case of FIGS. 3A-3E). In step 70, the exposed portions of the first photosensitive material layer are developed such that a second structure (i.e., a structure or an opening) is formed. In step 72, an optional full cure process is performed. In step 74, interconnect structures (e.g., wires, solder interconnect structures, etc) are formed and the process terminates in step 78.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming an electrical structure comprising:
    providing a first substrate structure comprising a substrate, an insulator layer formed over and in contact with said substrate, an electrically conductive wire formed within said substrate, and an electrically conductive pad formed over and in contact with said electrically conductive wire and said insulator layer, wherein a first portion of said electrically conductive pad is formed over and in contact with a first portion of said insulator layer, wherein a second portion of said electrically conductive pad is formed over and in contact with said electrically conductive wire, and wherein a third portion of said electrically conductive pad is formed over and in contact with a second portion of said insulator layer;
    forming a first layer over and in contact with said first substrate structure, said first layer comprising a first photosensitive material having a first polarity;
    performing, after said forming said first layer, a first partial cure process of said first layer;
    forming a second layer over and in contact with said first layer, said second layer comprising a second photosensitive material having a second polarity opposite to said first polarity;
    performing, after said forming said second layer, a second partial cure process of said second layer;
    placing, after said performing said second partial cure process, a mask structure over said second layer;
    simultaneously exposing a portion of said second layer and a portion of said first layer to a photo exposure light source;
    performing, after said simultaneously exposing, a third partial cure process of said portion of said second layer and said portion of said first layer;
    first developing, after said performing said third partial cure process, said portion of said second layer such that a first structure is formed;
    second developing, after said first developing, said portion of said first layer such that a second structure is formed, wherein said second structure comprises a first section and a second section, wherein said first section comprises a first vertical surface in contact with a first vertical surface of said first portion of said electrically conductive pad, wherein said second section comprises a first horizontal surface in contact with a first horizontal surface of said first portion of said electrically conductive pad; and performing, after said second developing, a full cure process of said first layer and said second layer.

2. The method of claim 1, wherein said first layer comprises a negative acting photosensitive material, and wherein said second layer comprises a positive acting photosensitive material.

3. The method of claim 1, wherein said first layer comprises a positive acting photosensitive material, and wherein said second layer comprises a negative acting photosensitive material.

4. The method of claim 1, wherein said first layer comprises a polyimide, and wherein said second layer comprises a polyimide.

5. The method of claim 1, wherein said first layer comprises a first thickness, wherein said second layer comprises a second thickness, and wherein said first thickness comprises a same thickness as said second thickness.

6. A method for forming an electrical structure comprising:
providing a first substrate structure comprising a substrate, an insulator layer formed over and in contact with said substrate, an electrically conductive wire formed within said substrate, and an electrically conductive pad formed over and in contact with said electrically conductive wire and said insulator layer, wherein a first portion of said electrically conductive pad is formed over and in contact with a first portion of said insulator layer, wherein a second portion of said electrically conductive pad is formed over and in contact with said electrically conductive wire, and wherein a third portion of said electrically conductive pad is formed over and in contact with a second portion of said insulator layer;
forming a first layer over and in contact with said first substrate structure, said first layer comprising a negative acting photosensitive material;
performing, after said forming said first layer, a first partial cure process of said first layer;
forming a second layer over and in contact with said first layer, said second layer comprising a positive acting photosensitive material;
performing, after said forming said second layer, a partial cure process of said second layer;
placing, after said performing said second partial cure process, a mask structure over said second layer;
simultaneously exposing a portion of said second layer and a portion of said first layer to a photo exposure light source;
performing, after said simultaneously exposing a third partial cure process of said portion of said second layer and said portion of said first layer;
first developing, after said simultaneously exposing, said portion of said second layer such that a first opening is formed in said second layer;
second developing, after said first developing, said portion of said first layer such that a first structure is formed from said portion of said first layer and a second opening is formed in a section of said first layer that surrounds said first structure, wherein said first structure comprises a first section and a second section, wherein said first section comprises a first vertical surface in contact with a first vertical surface of said first portion of said electrically conductive pad, wherein said second section comprises a first horizontal surface in contact with a first horizontal surface of said first portion of said electrically conductive pad; and performing, after said second developing, a full cure process of said second layer and said first layer.

7. The method of claim 6, wherein said first opening comprises tapered sidewalls.

8. The method of claim 6, wherein said first structure comprises tapered sides.

9. The method of claim 6, wherein said first layer comprises polyimide, and wherein said second layer comprises polyimide.

10. The method of claim 6, wherein said first layer comprises a first thickness, wherein said second layer comprises a second thickness, and wherein said first thickness comprises a same thickness as said second thickness.

11. The method of claim 6, wherein said substrate structure comprises an insulator layer formed over a substrate, wherein said first structure comprises a first section formed within a first opening formed within said insulator layer, and wherein said first structure comprises a second section formed over a top surface of said insulator layer.

12. A method for forming an electrical structure comprising:
providing a first substrate structure comprising a substrate, an insulator layer formed over and in contact with said substrate, an electrically conductive wire formed within said substrate, and an electrically conductive pad formed over and in contact with said electrically conductive wire and said insulator layer, wherein a first portion of said electrically conductive pad is formed over and in contact with a first portion of said insulator layer, wherein a second portion of said electrically conductive pad is formed over and in contact with said electrically conductive wire, and wherein a third portion of said electrically conductive pad is formed over and in contact with a second portion of said insulator layer;
forming a first layer over and in contact with said first substrate structure, said first layer comprising a positive acting photosensitive material;
performing, after said forming said first layer, a first partial cure process of said first layer;
forming a second layer over and in contact with said first layer, said second layer comprising a negative acting photosensitive material;
performing, after said forming said second layer, a second partial cure process of said second layer;
placing, after performing said second partial cure process, a mask structure over said second layer;
simultaneously exposing a portion of said second layer and a portion of said first layer to a photo exposure light source;
performing, after said simultaneously exposing, a third partial cure process of said portion of said first layer and said portion of said second layer;
first developing, after said performing said third partial cure process, said portion of said second layer such that a first opening is formed in said second layer;
second developing, after said first developing, said portion of said first layer such that a first structure is formed from said portion of said first layer and a second opening is formed in a section of said first layer that surrounds said first structure, wherein said first structure comprises a first section and a second section, wherein said first section comprises a first vertical surface in contact with a first vertical surface of said first portion of said electrically conductive pad, wherein said second section comprises a first horizontal surface in contact with a first horizontal surface of said first portion of said electrically conductive pad; and performing, after said second developing, a full cure process of said first layer and said second layer.

13. The method of claim 12, wherein said first layer comprises polyimide, and wherein said second layer comprises polyimide.

14. The method of claim 12, wherein said first layer comprises a first thickness, wherein said second layer comprises a second thickness, and wherein said first thickness comprises a same thickness as said second thickness.

15. The method of claim 12, wherein said first developing comprises using a solvent based developer solution.

16. The method of claim 12, wherein said second developing comprises using an acid based developer solution.

17. A method for forming an electrical structure comprising:

providing a first substrate structure comprising a substrate, an insulator layer formed over and in contact with said substrate, an electrically conductive wire formed within said substrate, and an electrically conductive pad formed over and in contact with said electrically conductive wire and said insulator layer, wherein a first portion of said electrically conductive pad is formed over and in contact with a first portion of said insulator layer, wherein a second portion of said electrically conductive pad is formed over and in contact with said electrically conductive wire, and wherein a third portion of said electrically conductive pad is formed over and in contact with a second portion of said insulator layer;

forming a first layer over and in contact with said first substrate structure, said first layer comprising a positive acting photosensitive material;

performing, after said forming said first layer, a first partial cure process of said first layer;

forming, a second layer over and in contact with said first layer, said second layer comprising a negative acting photosensitive material;

performing, after said forming said second layer, a second partial cure process of said second layer;

placing, after said performing, after said performing said second partial cure process, a mask structure over said second layer;

simultaneously exposing a portion of said first layer and a portion of said second layer to a photo exposure light source;

performing, after said simultaneously exposing, a third partial cure process of said portion of said first layer and said portion of said second layer;

first developing after said performing said third partial cure process, said portion of said second layer such that a first opening is formed in said second layer;

removing, after said first developing, said mask structure from over said second layer;

exposing, after said removing, said first layer and said second layer to said photo exposure light source; and second developing, after said exposing, said portion of said first layer such that a second opening is formed in said first layer and a first structure is formed from said portion of said first layer, said second opening formed below said first opening, wherein said first structure comprises a first section and a second section, wherein said first section comprises a first vertical surface in contact with a first vertical surface of said first portion of said electrically conductive pad, wherein said second section comprises a first horizontal surface in contact with a first horizontal surface of said first portion of said electrically conductive pad.

18. The method of claim 17, wherein said first layer comprises polyimide, and wherein said second layer comprises polyimide.

19. The method of claim 17, wherein said first layer comprises a first thickness, wherein said second layer comprises a second thickness, and wherein said first thickness comprises a same thickness as said second thickness.

20. The method of claim 17, further comprising:

forming an electrically conductive structure within a portion of said first opening and a portion of said second opening.

* * * * *